(12) United States Patent
Whitworth et al.

(10) Patent No.: US 8,327,523 B2
(45) Date of Patent: Dec. 11, 2012

(54) HIGH DENSITY PLANARIZED INDUCTOR AND METHOD OF MAKING THE SAME

(75) Inventors: Adam J. Whitworth, Los Altos, CA (US); Wenjiang Zeng, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1121 days.

(21) Appl. No.: 11/564,241

(22) Filed: Nov. 28, 2006

(65) Prior Publication Data
US 2008/0120828 A1     May 29, 2008

(51) Int. Cl.
*H01F 7/06* (2006.01)

(52) U.S. Cl. ............ 29/606; 29/602.1; 29/605; 216/22; 216/39; 216/41; 216/48; 336/65; 336/83; 336/223; 336/232; 336/233

(58) Field of Classification Search .......... 29/602.1, 29/603.13–603.16, 603.18, 606, 609; 216/22, 216/39, 41, 48; 257/531; 336/65, 83, 200, 336/206–208, 223, 232, 233; 427/127, 128
See application file for complete search history.

(56) References Cited

U.S. PATENT DOCUMENTS

| | | | |
|---|---|---|---|
| 5,892,425 A | 4/1999 | Kuhn et al. | |
| 6,466,401 B1 * | 10/2002 | Hong et al. | 360/123.25 |
| 6,861,937 B1 * | 3/2005 | Feng et al. | 336/200 |
| 2002/0101322 A1 | 8/2002 | Liu et al. | |
| 2004/0212038 A1 | 10/2004 | Ott et al. | |
| 2005/0104158 A1 | 5/2005 | Bhattacharjee et al. | |

OTHER PUBLICATIONS

Selmi et al., "Design of an x-band transformer-coupled amplifier with improved stability and layout" IEEE J. Solid-State Circ., Vo.. 28, No. 6,, Jun. 1993 (pp. 701-703).

* cited by examiner

*Primary Examiner* — Paul D Kim
(74) *Attorney, Agent, or Firm* — Pillsbury Winthrop Shaw Pittman LLP

(57) ABSTRACT

There is provided a method of making two electrically separated inductors using deposition and wet-etching techniques, which inductors are formed by interwinding one of the inductors within the other inductor on the same planar level. In still another aspect of the invention, there is provided a method of making various levels inductors, each level having at least two electrically separated inductors, using deposition and wet-etching techniques. The inductors on each planar level are formed by interwinding one of the inductors within the other inductor, and then stacking these in a preferred manner. In still another aspect, there is provided a manner of connecting together inductors formed according to the above methods in order to achieve various inductor configurations.

18 Claims, 9 Drawing Sheets

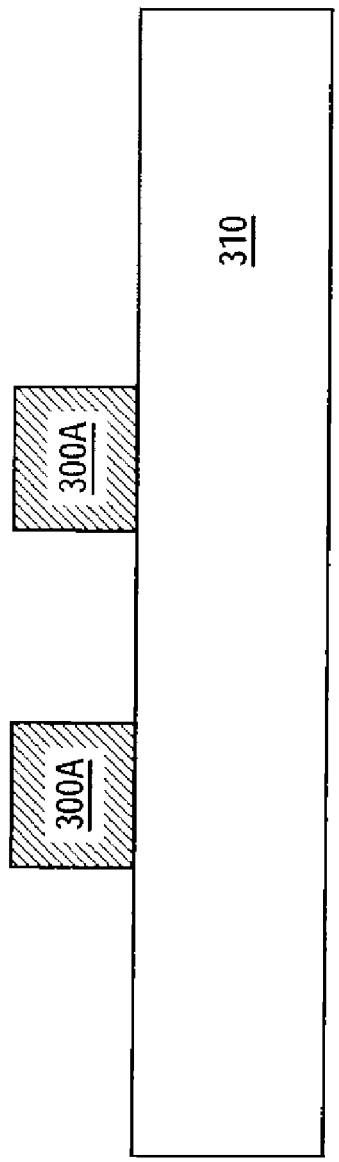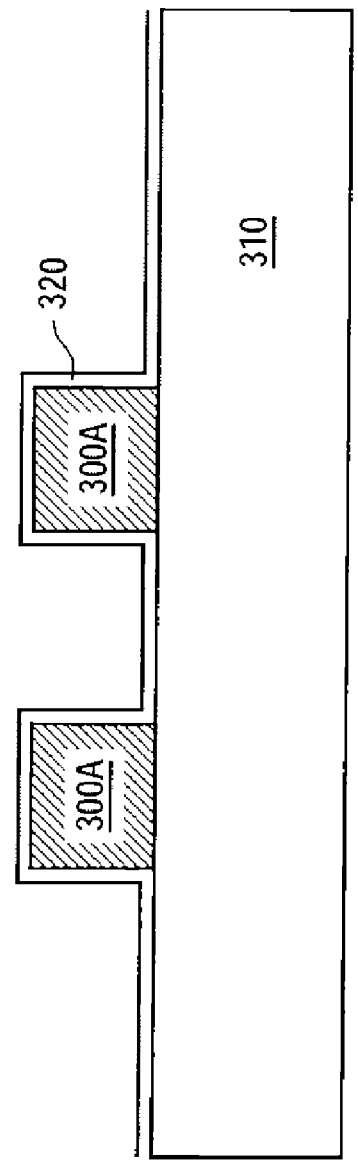

HIGH DENSITY PLANARIZED INDUCTOR AND METHOD OF MAKING THE SAME

FIELD OF THE INVENTION

The present invention provides a high density planarized inductor, as well as high density combination of inductors, and a method of making the same.

BACKGROUND OF THE INVENTION

Inductors are well-known circuit components that are used to enhance the capabilities of a device. It is also well-known to fabricate inductors of various geometries and shapes on integrated circuit devices.

A preferred shape of inductor that is used in fabricating semiconductor devices is a planar spiral, as is illustrated in FIGS. 1 and 2A and 2B. While a planar spiral shape has advantages, they can be difficult to manufacture. In particular, when using deposition and wet-etching techniques to make inductors, a relatively wide spacing, which leads to a relatively low inductance per unit area, as is shown in the side view of FIG. 2B that is taken along line A-A of FIG. 2A in which there is an inductor 200 that has a width 210 and a spacing 220 which may be greater than 10 um.

It is also known to fabricate multiple inductors on a single integrated circuit chip, as is also shown in FIG. 1A. It is known, for example, to fabricate different inductors 110 and 120 a shown in FIG. 1A on different layers of a semiconductor device, in order to provide multiple inductors. It is also known to fabricate multiple inductors on a single layer, also in order to provide multiple inductors. These multiple inductors can then be interconnected to obtain greater inductance, a greater trace length, matched inductance, and/or other characteristics. While these various configurations have advantages, all suffer from a disadvantage of using a considerable amount of area on the semiconductor chip.

FIG. 1B also illustrates that an interwinding of two inductors is also known, as described in Selmi et al. "Design of an X-band Transformer-Coupled Amplifier with Improved Stability and Layout," IEEE Journal of Solid-State Circuits, Vol 28, No. 6, June 1993.

SUMMARY OF THE INVENTION

The present invention provides a high density planarized inductor, as well as high density combination of inductors, and a method of making the same.

In one aspect of the invention, there is provided a method of making two electrically separated inductors using deposition and etching techniques, which inductors are formed by interwinding one of the inductors within the other inductor on the same planar level.

In still another aspect of the invention, there is provided a method of making various levels of inductors, each level having at least two electrically separated inductors, using deposition, etching and planarization techniques. The inductors on each planar level are formed by interwinding one of the inductors within the other inductor, and then stacking these in a preferred manner.

In still another aspect, there is provided a manner of connecting together inductors formed according to the above methods in order to achieve various inductor configurations.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIGS. 3A-3D illustrate a method of making interwound inductors according to the present invention.

DETAILED DESCRIPTION OF THE PREFERRED EMBODIMENTS

Figure 1B:
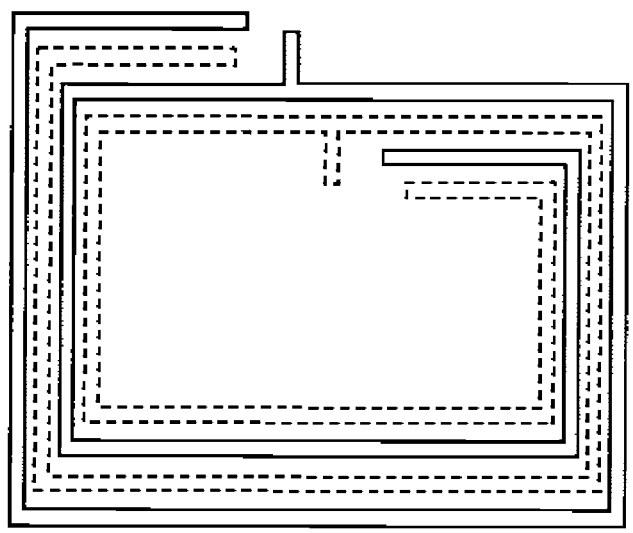
FIGS. 1A and 1B illustrate conventional inductors formed on a semiconductor.
Figure 1A:
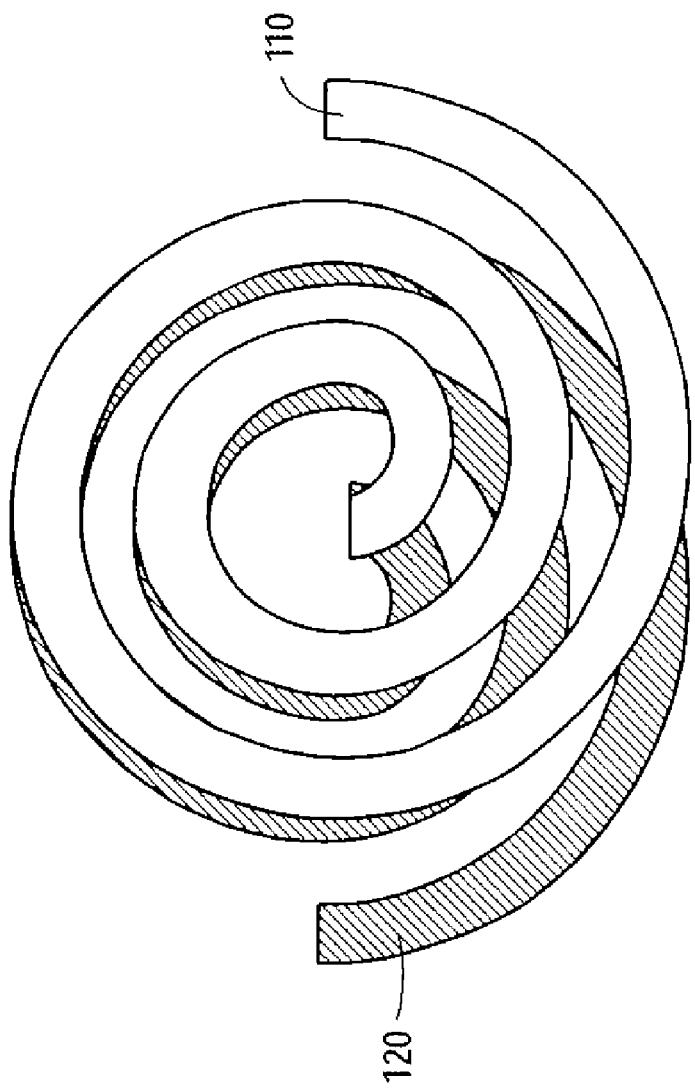
Figure 2A:
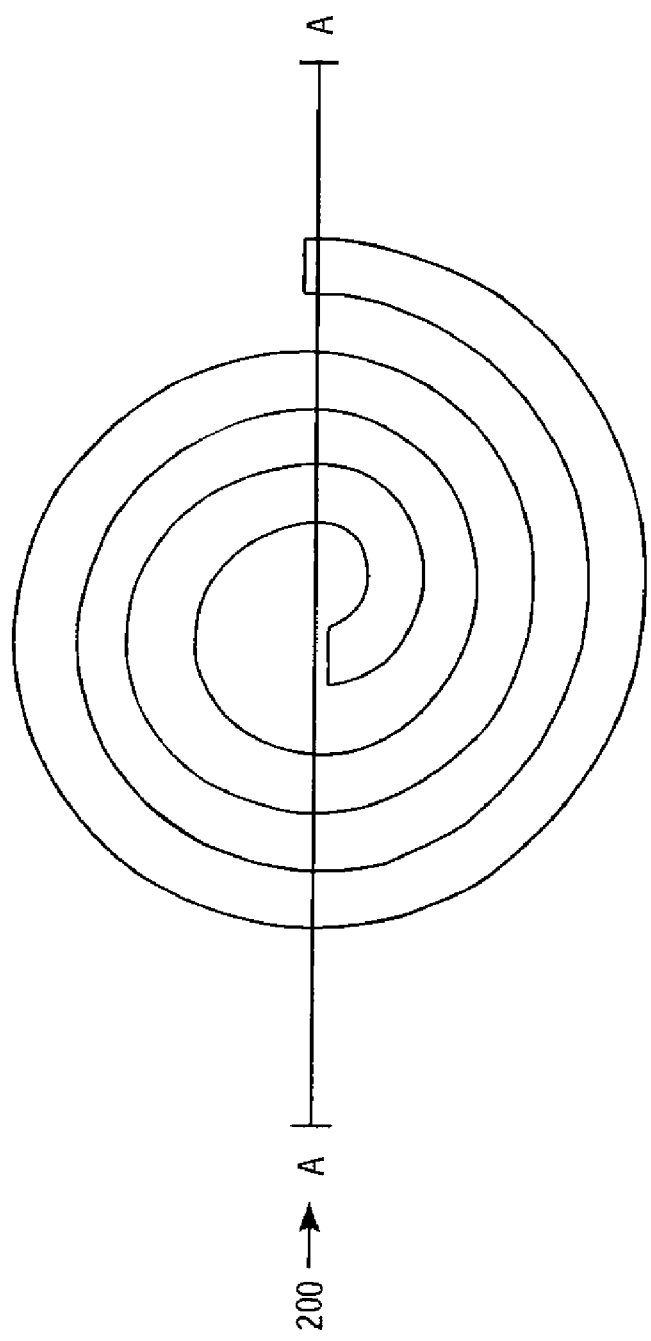
FIGS. 2A and 2B illustrate a top and side view of a conventional spiral inductor.
Figure 2B:
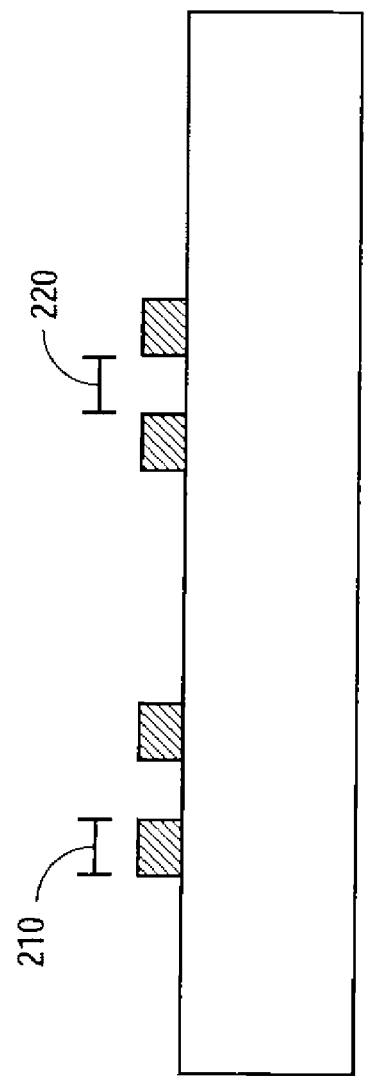

FIGS. 3A-3D illustrate a method of making interwound inductors 300A and 300B according to the present invention. These figures illustrate the inductors 300A and 300B being formed in a side view, similar to the view illustrated along line A-A of FIG. 1 as described previously. A top view of the inductors as formed is illustrated in FIGS. 4A-4C, which are referred to hereinafter.

FIG. 3A illustrates the application of a metal inductor 300A over a substrate 310. While the substrate is illustrated as a uniform layer from top to bottom, it is understood that the inductors according to the present invention can be fabricated on top of many different types of insulating layers. It is also understood that the metal inductor 300A will be formed as illustrated by a series of steps which can be varied. For example, in one method, a metal layer is deposited over the entire surface, thereafter a mask is applied over the metal surface, and the mask is used to etch away undesired metal from the metal layer in order to achieve. Still further, while preferably a metal inductor, inductor 300A, or the other inductors described herein, can be made of conductors that have materials other than metal, though such non-metallic materials are typically not preferred.

FIG. 3B illustrates a further processing step of conformally applying an insulator 320 over the metal inductor 300A. As illustrated, the conformal application of the insulator 320 applies a predetermined thickness of insulator 320 over the metal inductor. For an inductor 300A in which the spacing between each coil is 10 um and a height of 5 um, the inductor 320 will typically have a thickness of less than 1 um. This results in a thickness of the inductor 300A to thickness of the insulator 320 ratio of greater than 10. The thickness of this insulating layer can also be varied to adjust the coupling between inductors 300A and 300B.

Figure 3C:
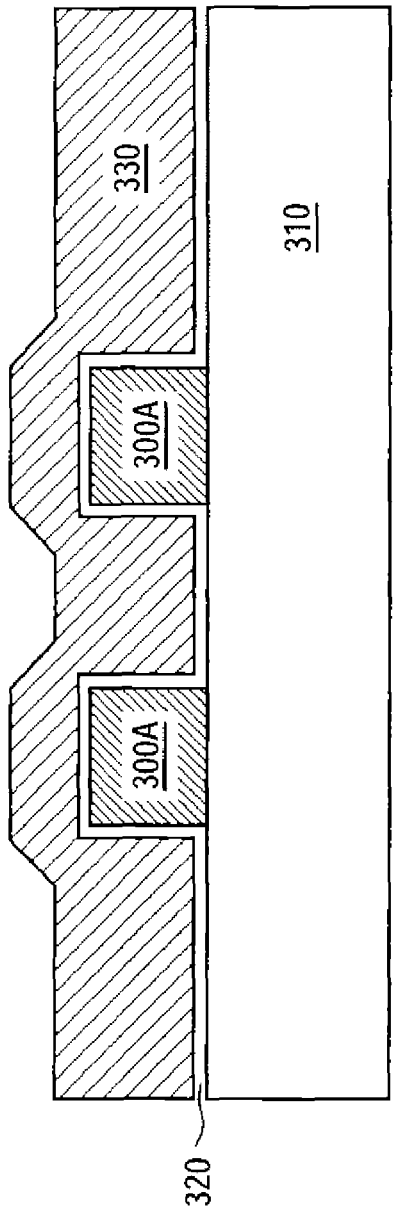
Figure 4A:
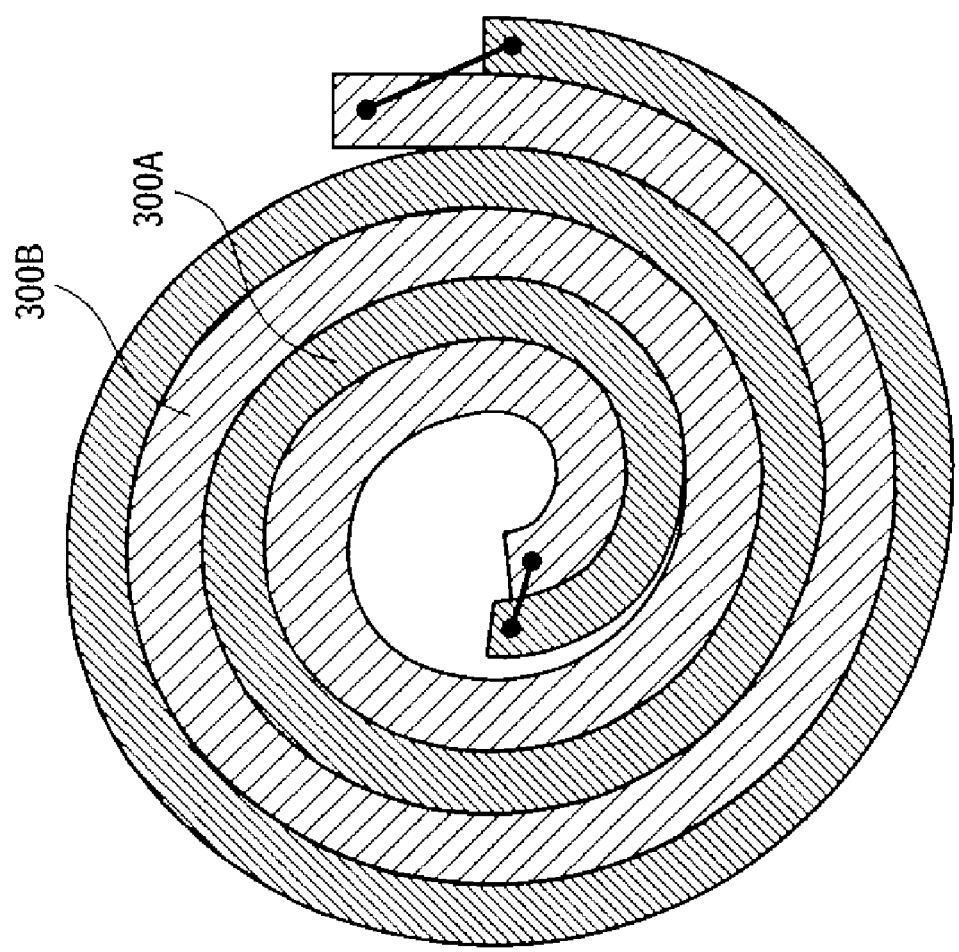
FIGS. 4A-4C illustrate various connection configurations of the interwound inductors according to the present invention.
Figure 4B:
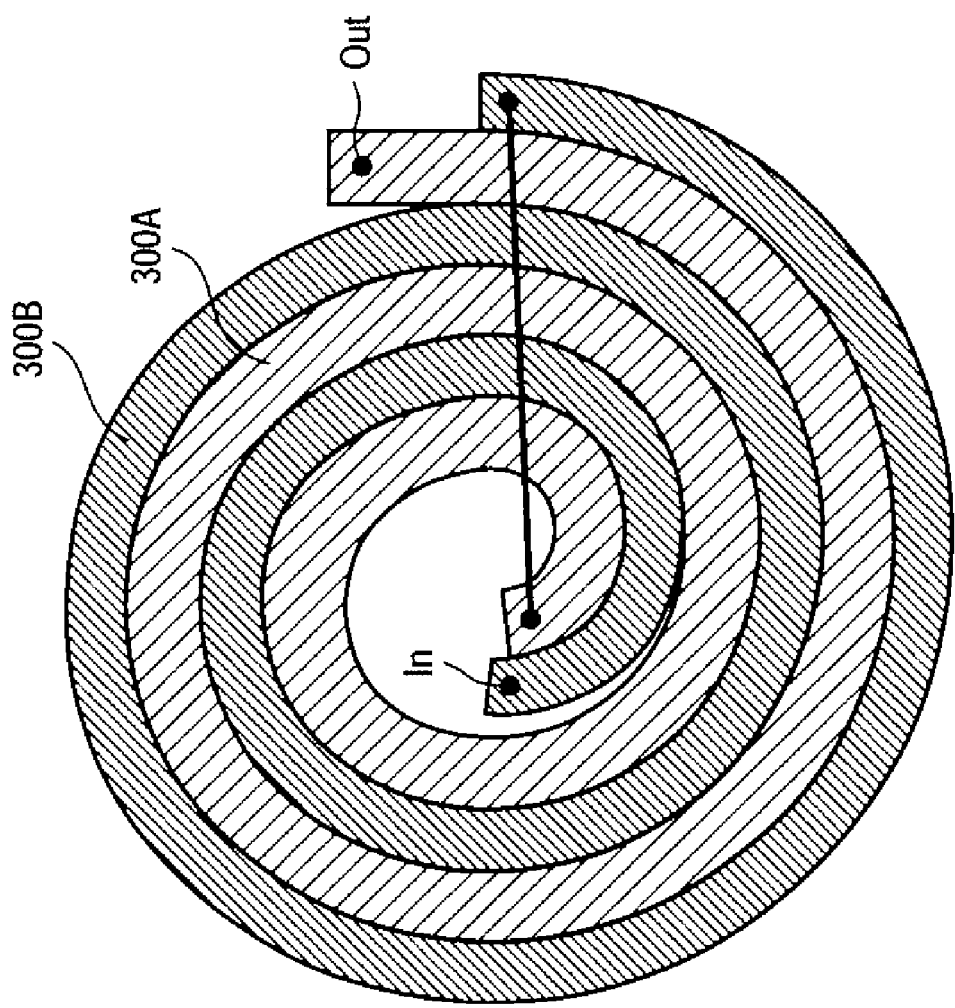
Figure 4C:
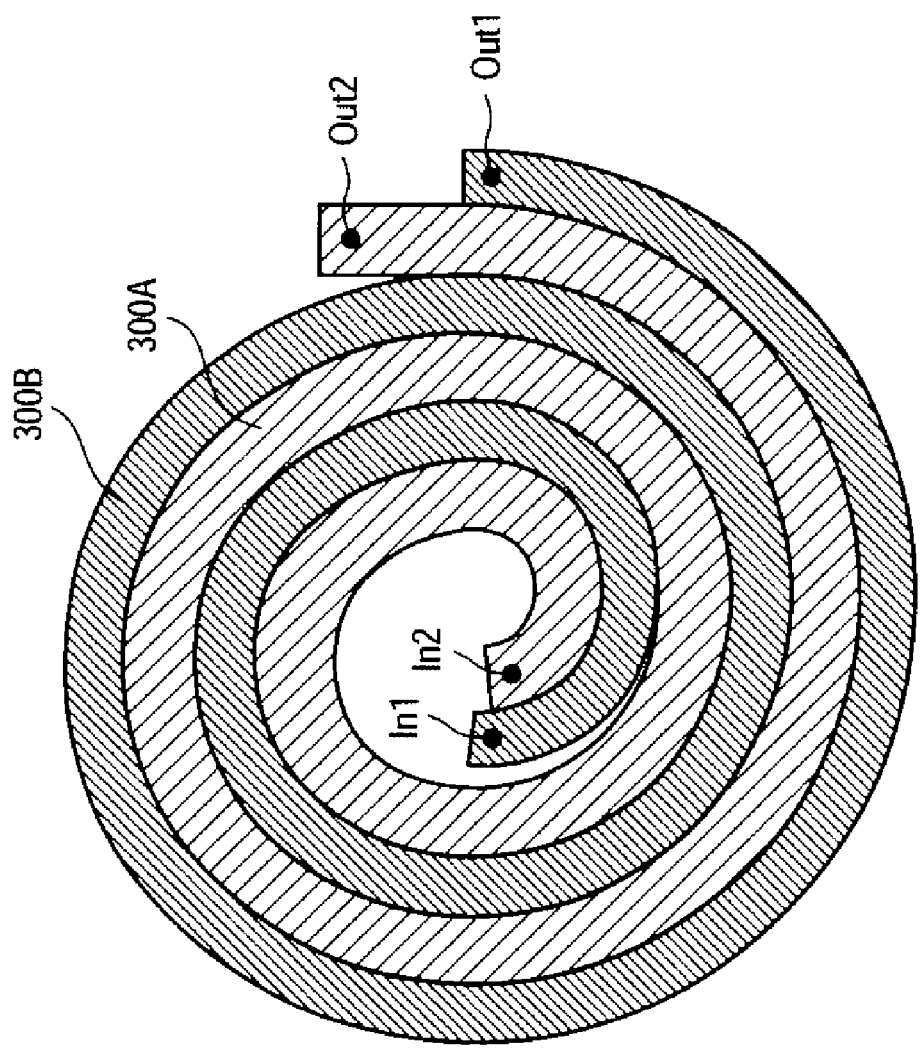

FIG. 3C illustrates the application of a metal layer 330 over the insulator layer 320, which layer completely fills the wall between the insulator 320.

Figure 3D:
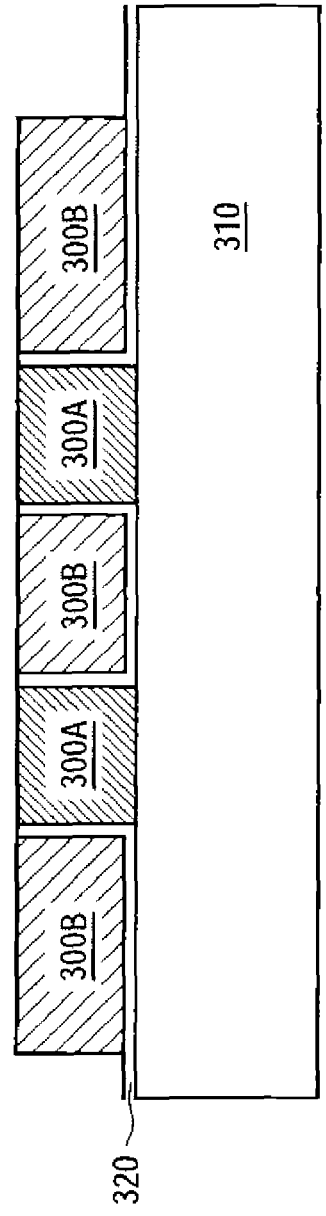

FIG. 3D then shows the step of removing the portion of the metal layer 330 that is above the top surface of the inductor 300A, in order to obtain the spiral coils that make up the inductor 300B as shown. Preferably used is a conventional chemical mechanical polishing, though other removal methods can be used.

FIGS. 4A-4C illustrate a top view of the inductors 300A and 300B that were formed as described in the previous FIGS. 3A-3D. Illustrated in each of FIGS. 4A-4C are various connection configurations of the interwound inductors 300A and 300B according to the present invention.

FIG. 4A illustrates a configuration in which inductors 300A and 30B are shorted together, in which case a single extra-wide inductor is formed, which inductor has a very close coil spacing (which spacing is determined by the thickness of the insulator 320 as described previously with reference to FIG. 3B), and thus a very high inductance value.

FIG. 4B illustrates connecting the inductors 300A and 300B together in series, in order to obtain an extra-long inductor, which will also then have a high inductance. In this configuration, in order to achieve the electrical connections as shown, it will be understood that another level of electrical interconnect is needed.

FIG. 4C illustrates keeping each of the inductors 300A and 300B separate. This configuration can be used, for example, in making a transformer or a common-mode choke.

Figure 5B:
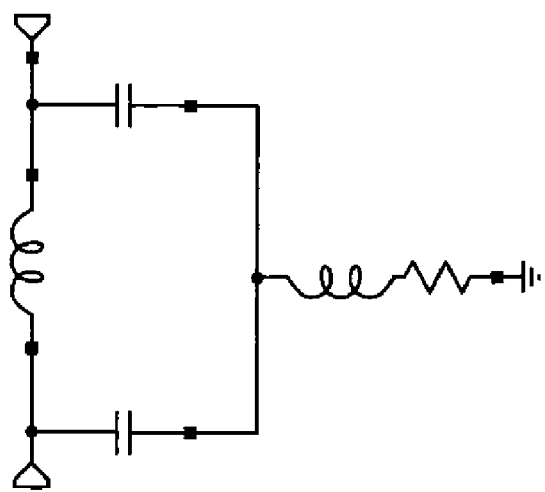
FIG. 5A illustrates the characteristics of the interwound inductors according to the present invention, for the exemplary circuit illustrated in FIG. 5B.
Figure 5A:
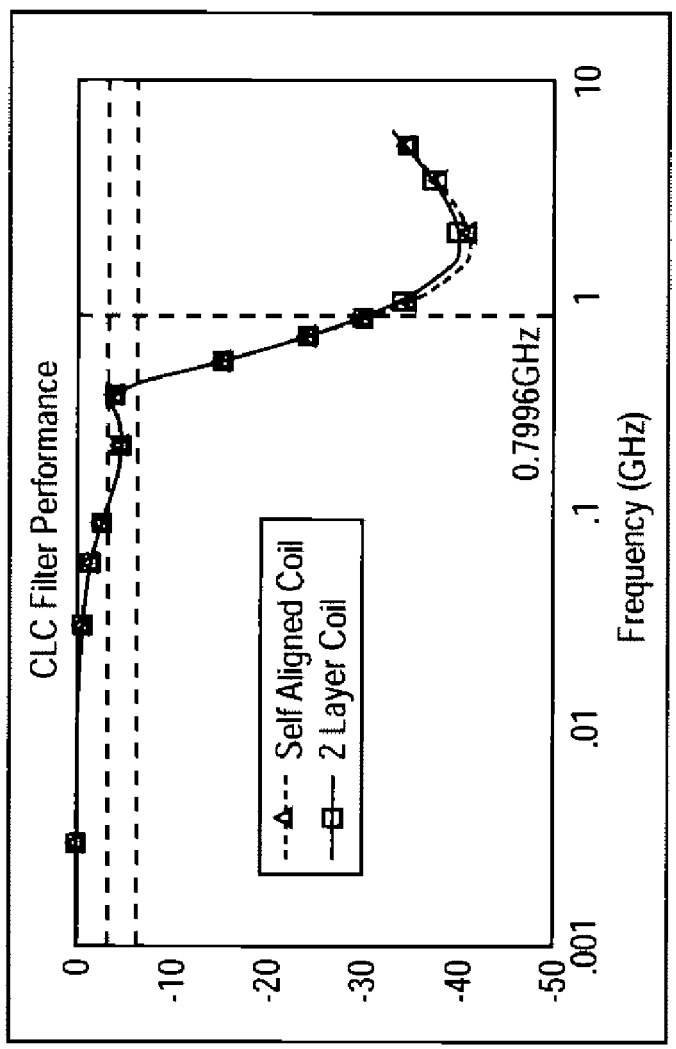

FIG. 5A illustrates the characteristics of the interwound inductors according to the present invention, for the exemplary circuit illustrated in FIG. 5B. As can be seen, the characteristics of the new "self-aligned coil" are superior to the characteristics of the "2-layer coil" which is a typical example of prior art like FIG. 1A.

Figure 6:
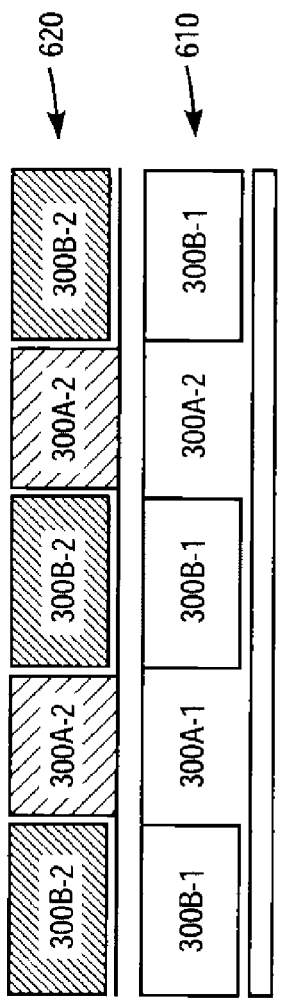
FIG. 6 illustrates multiple levels of interwound inductors according to the present invention.

FIG. 6 illustrates multiple levels 610 and 620 of interwound inductors according to the present invention. As illustrated, therefore, there is achieved interwound inductors 300A-1 and 300B-1 from level 610, and interwound inductors 300A-2 and 300B-2 from level 620. Further levels can be obtained as well. The more closely the inductors can be formed, the higher the higher the inductance. It should be noted that the quad-coil of FIG. 7 has more than twice the inductance of the prior-art coil of FIG. 1A.

Figure 7:
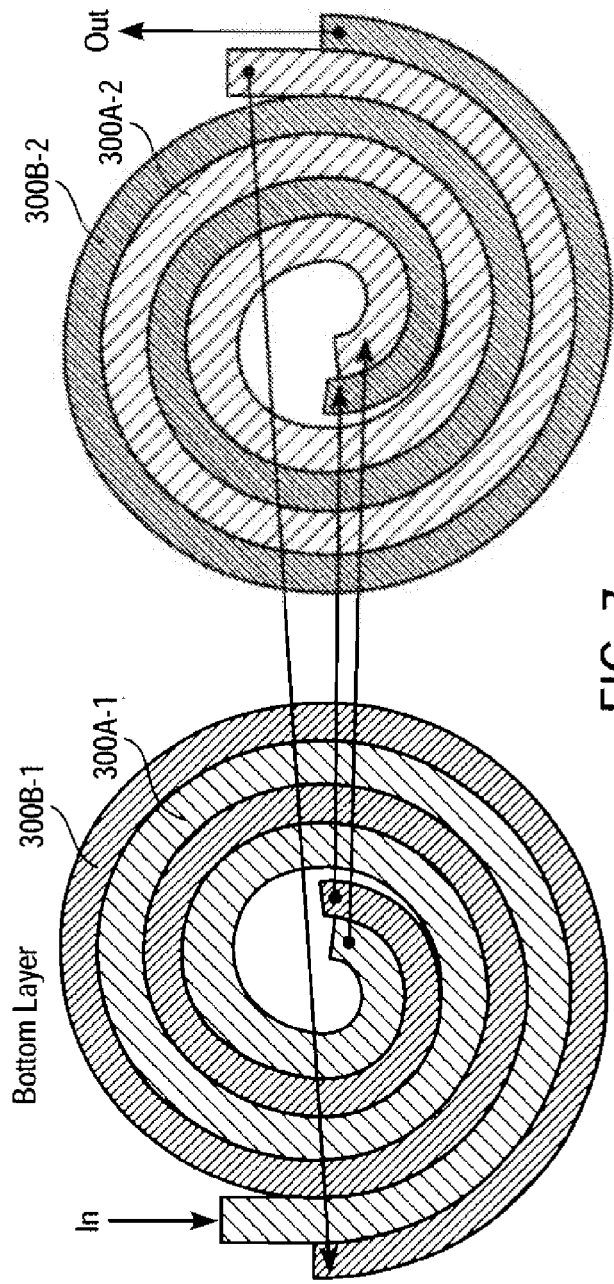
FIG. 7 illustrates an example of a connection configuration based upon the multiple levels of interwound inductors set forth in FIG. 6.

FIG. 7 illustrates an example of a connection configuration based upon the multiple levels of interwound inductors set forth in FIG. 6. As shown, the inductors are attached in series, to provide a very large inductance. For the particular embodiment described with respect to FIG. 3A-3D, an inductance on the order of greater than 100 nH.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. A method of making at least one high density planarized inductor having interwound conductive elements comprising the steps of:
    forming a first conductive element over an insulator on a substrate of a semiconductor device, the first conductive element having a first coil shape with a first plurality of coils in which the conductive element has a width and there exists a spacing adjacent the width that causes the plurality of coils;
    forming an insulator over the first conductive element, the insulator having sidewalls and creating therebetween a void with a void width that has a second coil shape; and
    creating a second conductive element on the substrate, the second conductive element having the second coil shape with a second plurality of coils, wherein the second plurality of coils have the second coil shape that is that of the void and the void width, wherein
    each of the at least one high density planarized inductor comprises one or more of the first and second conductive elements.

2. The method according to claim 1 wherein the step of creating the second conductive element includes the steps of:
    filling the void with a conductive material to form the second conductive element.

3. The method according to claim 2 wherein the step of filling overfills the conductive material, and further including the step of removing the overfilled conductive material.

4. The method according to claim 3 wherein the step of removing substantially planarizes the first and second conductive elements.

5. The method according to claim 1 further including the step of electrically connecting the first and second conductive elements to form one high density planarized inductor.

6. The method according to claim 5 wherein the first and second conductive elements are electrically connected in series.

7. The method according to claim 5 wherein the first and second conductive elements are electrically connected together at each end.

8. The method according to claim 5 and further comprising connecting the one high density planarized inductor to at least one capacitor, thereby obtaining a filter circuit.

9. The method according to claim 5, wherein the one high density planarized inductor is provided in a common-mode choke circuit.

10. The method according to claim 1 wherein the first and second conductive elements are formed without electrical connection and thereby form two separate planarized inductors.

11. The method according to claim 10 wherein the two separate planarized inductors are configured as a transformer.

12. The method according to claim 1 further including the steps of:
    forming another insulator over the first and second conductive elements;
    repeating the steps of forming conformally depositing and creating to create another set of first and second conductive elements at a planar level above the previously created first and second conductive elements.

13. The method according to claim 12 further including the step of electrically connecting the first and second conductive elements with the another set of first and second conductive elements to obtain the at least one high density planarized inductor.

14. The method according to claim 13 wherein the at least one high density planarized inductor is provided in a filter circuit comprising one or more capacitors.

15. The method according to claim 13 wherein the at least one high density planarized inductor is provided in a common-mode choke circuit.

16. The method according to claim 13 wherein the at least one high density planarized inductor comprises two planarized inductors configured as a transformer.

17. The method according to claim 1, wherein the step of forming the first conductive element includes using deposition and etching techniques.

18. The method according to claim 17, wherein the first and second conductive elements are formed on a first planar level.

* * * * *